United States Patent [19]

Bendall

[11] Patent Number: 4,812,764
[45] Date of Patent: Mar. 14, 1989

[54] CALIBRATED DECOUPLING OF TIGHTLY COUPLED CONCENTRIC SURFACE COILS

[75] Inventor: Max R. Bendall, Queensland, Australia

[73] Assignee: Varian Associates, Inc., Palo Alto, Calif.

[21] Appl. No.: 175,700

[22] Filed: Mar. 31, 1988

[51] Int. Cl.[4] .............................................. G01R 33/20
[52] U.S. Cl. ..................................... 324/318; 324/322
[58] Field of Search ............... 324/300, 307, 309, 318, 324/319, 320, 322; 128/653

[56] References Cited

U.S. PATENT DOCUMENTS

| | | | |
|---|---|---|---|
| 4,641,098 | 2/1987 | Doty | 324/322 |
| 4,680,548 | 7/1987 | Edelstein | 324/318 |
| 4,724,389 | 2/1988 | Hyde et al. | 324/318 |
| 4,733,190 | 3/1988 | Dembinski | 324/318 |
| 4,734,647 | 3/1988 | Yoshimura | 324/318 |
| 4,751,464 | 6/1988 | Bridges | 324/318 |
| 4,782,298 | 11/1988 | Arakawa et al. | 324/322 |

Primary Examiner—Michael J. Tokar
Attorney, Agent, or Firm—Stanley Z. Cole; Gerald M. Fisher; Edward H. Berkowitz

[57] ABSTRACT

A pair of coupled surface coils are arranged to provide active detuning whereby the shape of the RF field due to the RF current in one coil is modified in a calibrated fashion by the RF current in the second coil whereby a selected fraction of the RF field of one coil may be selectively added or substracted from the RF field of the one other coil thereby shaping the RF field.

4 Claims, 3 Drawing Sheets

CALIBRATED DECOUPLING OF TIGHTLY COUPLED CONCENTRIC SURFACE COILS

FIELD OF THE INVENTION

This invention is in the field of in vivo NMR analysis and particularly relates to the use of surface coils for such application.

BACKGROUND OF THE INVENTION

Medical imaging by nuclear magnetic resonance has progressively improved over the course of the last decade to an impressive degree. Concomitant with the spatial resolution achieved through the imaging procedure, there is a strong desire to practice noninvasive detailed analysis of the chemical nature of the subject matter imaged. The potential of NMR as an analytical tool for in vivo studies depends upon the ability to localize spectral data to a specific selected spatial volume. One of the approaches for such spatial localization is to shape the RF field produced by "depth pulses" applied from a pair of closely coupled RF coils disposed on the surface of the body under study. It is known to so arrange such coils, each comprising a tuned circuit, with circuit means to actively detune either said coil with respect to the other. In this prior art, each said coil is terminated in a λ/4 cable which is selectively open or shorted by a reed relay located outside the magnetic field of the instrument. See Bendall, et al., J. Mag. Res., V. 60, pp. 473-478 (1984).

In the prior art, effort has been directed toward rendering "invisible", one coil to the other, of a pair of closely disposed coils. Thus, prior art exploited active detuning schemes to reduce the effect of one inactive, but closely coupled coil, on the other, active coil. In some instances the two coils are respective portions of each of a transmit (RF source) circuit and a receive (RF sink) circuit. In other instances, both coils may serve as transmit circuit members, albeit at different times, their differing geometry providing an additional degree of freedom within a pulse sequence. Examples of these may be found in Edelstein, et al., J. Mag. Res., v. 67, pp. 156-161 (1986) and in Bendall, Chem. Phys. Lett., v. 99, p. 310 (1983).

BRIEF DESCRIPTION OF THE INVENTION

In the present invention, it is recognized that the controlled electronic presence of one coil with respect to another coupled therewith and not completely detuned permits yet another technique for affecting the combined RF field of the coil pair, both in geometry and magnitude. Thus, the superposition of the RF field of the respective coils will exhibit spatial distribution affected by the relative contributions of respective tuned and partially detuned circuits.

DETAILED DESCRIPTION OF THE INVENTION

Figure 1:
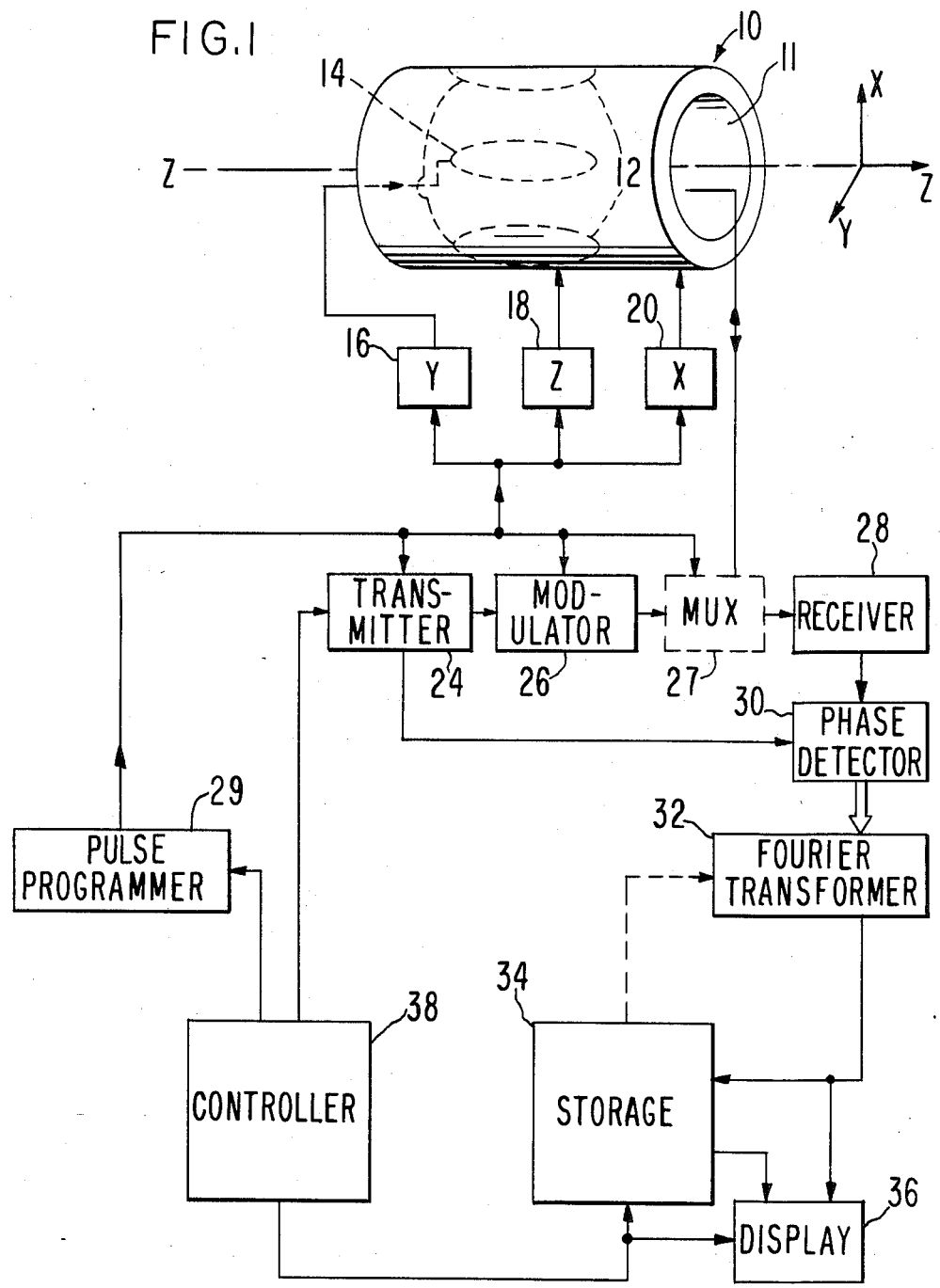
FIG. 1 illustrates the context of the invention.

Turning now to FIG. 1 there is shown a schematized apparatus forming the context in which the invention is practiced. A magnet 10 having bore 11 provides a main magnetic field. In order to control the magnetic field with precision in time and direction, there are provided magnetic field gradient coils 12 and 14 schematically represented. These and an additional gradient coil (not shown) are driven by gradient power supplies 16, 18 and 20, respectively. Additionally, other gradient coils (not shown) and power supplies (not shown) may be required for compensating residual undesired spatial inhomogeneities in the basic magnetic field. An object for analysis (hereafter "sample") is placed within the magnetic field in bore 11 and the sample is subject to irradiation by RF power, such that the RF magnetic field is aligned in a desired orthogonal relationship with the magnetic field in the interior of bore 11. This is accomplished through a transmitter coil in the interior of bore 11 and not shown in FIG. 1. Resonant signals are induced in a receiver coil, proximate the sample within bore 11 and also not shown.

As shown in FIG. 1, RF power is provided from transmitter 24, modulated through modulator 26 to yield pulses of RF power which are amplified by amplifier 31 and thence directed via multiplexer 27 to the RF transmitter coil (not shown) located within bore 11. Transmit and receive coils are not concurrently active as such in a Fourier transform apparatus. The identical coil may be employed for both functions if so desired. Thus, a multiplexer 27 is provided to isolate the receiver from the transmitter. In the case of separate transmit and receive coils, element 27, while not precisely a multiplexer, will perform a similar isolation function to control receiver operation.

The modulator 26 is controlled by pulse programmer 29 to provide RF pulses of desired amplitude, duration and phase relative to the RF carrier at preselected time intervals. The pulse programmer also controls the gradient power supplies 16, 18 and 20, if such gradients are required. These gradient power supplies may maintain selected static gradients in the respective gradient coils if so desired.

The transient nuclear resonance waveform is processed by receiver 28 and further resolved in phase quadrature through phase detector 30. The phase resolved time domain signals from phase detector 30 are presented to Fourier transformer 32 for transformation to the frequency domain in accordance wit specific requirements of the processing. Conversion of the analog resonance signal to digital form is commonly carried out on the phase resolved signals through analog to digital converter (ADC) structures which may be regarded as a component of phase detector 30 for convenience.

It is understood that Fourier transformer 32 may, in practice, act upon a stored (in storage unit 34) representation of the phase resolved data. This reflects the common practice of averaging a number of time domain phase resolved waveforms to enhance the signal-to-noise ratio. The transformation function is then applied to the resultant averaged waveform. Display device 36 operates on the acquired data to present same for inspection. Controller 38, most often comprising one or more computers, controls and correlates the operation of the entire apparatus.

Figure 2:
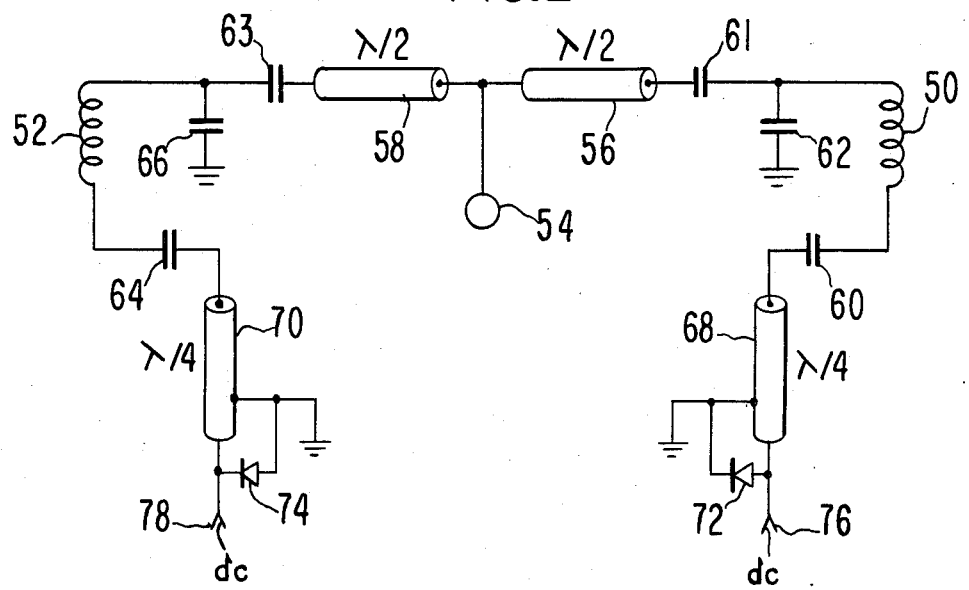
FIG. 2 illustrates a circuit arrangement of the present invention.

Turning now to FIG. 2 there is shown a preferred circuit for the practice of the invention in which RF coils 50 and 52 are, typically, surface coils concentrically disposed on the surface of the body under investigation. An RF source, not shown, is applied at 54 and the signal is split and distributed to the two tuned circuits through half wavelength transmission lines 56 and 58. Capacitances 60 and 62 together with coil 50 form a tuned circuit designed to resonate at a desired frequency, $F_0$. Capacitances 64 and 66, likewise, form a tuned circuit with coil 52, designed to resonate at a frequency $F_2$, selectable over a range of frequencies including $F_0$. Each of the tuned circuits may be regarded as a frequency dependent impedance terminated through respective quarter wavelength transmission lines 68 and 72. These latter provide a very high impedance or nearly zero impedance in their respective paths depending upon whether the respective lines 68 and 72 are open or short-circuited. PIN diodes 72 and 74 controlled by DC voltages applied at points 76 and 78, respectively, determine the open or shorted condition of the respective $\lambda/4$ lines.

The $\lambda/4$ lengths preferably comprise a high quality coaxial cable. RG 217/U has been used successfully for this purpose. It has been found in practice that the shields of the $\lambda/4$ and $\lambda/2$ cables should be carefully grounded to each other along their lengths to prevent spurious resonances.

For the PIN diodes 72 and 74, type UN4301 has been used successfully. It may be preferable to implement each of these diodes from two such in series to minimize leakage and the possibility of breakdown. When a pair of series diodes are thus employed, the switching times (closed to open) for the second diode may become excessive for some applications in comparison with use of a single diode.

The DC control of the PIN diodes were conservatively set at 200 ma (forward current) and 10 volts reverse bias. In fact, at frequencies typical of the medical analytic NMR application, e.g., of order $10^2$ MHz, zero reverse bias will suffice because the charge stored in the PIN diode is not appreciably discharged over an RF period.

In FIG. 3, there are shown related circuit arrangements which have been investigated in this study. For convenience, only one-half of the schematic is illustrated. As far as possible, corresponding components bear the identical labels. The full circuit in each case is realized as in the circuit of FIG. 2. These circuit arrangements were then tested to ascertain the degree to which one such coil could be completely detuned. The test was conducted by imaging a homogeneous slice phantom on the surface of which the coils were placed. Examples of such images are shown in FIG. 4. A coil is deemed completely detuned when the image obtained using the tuned coil (for excitation and data acquisition) is unchanged after physically removing the detuned coil.

Figure 3A:
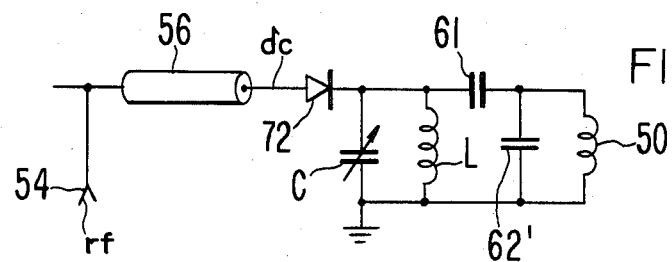
FIGS. 3a, 3b and 3c show some further variations of circuits for practice of the invention.
Figure 3B:
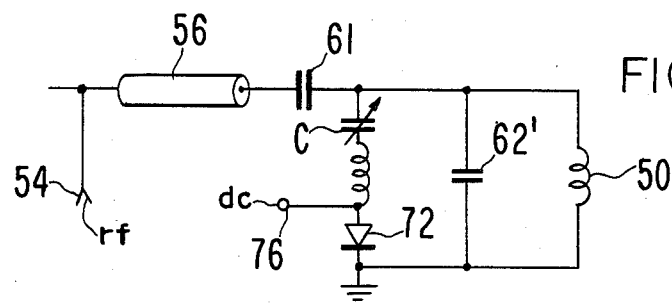
Figure 3C:
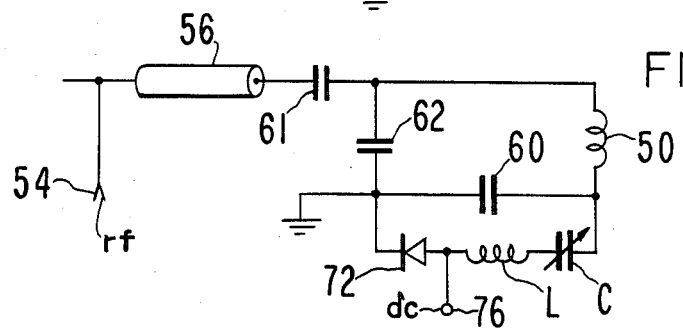

The circuits of FIG. 2 together with FIGS. 3a–c, inclusively, were also compared on the basis of efficiency/sensitivity. Such comparison is obtained from relative pulse times in an arrangement where a small phantom is disposed at a set distance on the axis of the coplanar concentric coils. This approach is rendered realistic by loading one side of the coils with a 33% saline solution which duplicates the ordinary conditions experienced for a typical in vivo investigation.

These four circuits for actively detuning a coil all depend on modifying the resonant frequency by modifying a circuit element. This modification can be actively switched on, so detuning the coil, by making the PIN diodes in FIGS. 2, 3b and 3c conducting and the PIN diode in FIG. 3a non-conducting, by applying a direct current/voltage (DC) between the DC input in each circuit and ground. In initial studies, the complicating effects of the PIN diodes in D inputs were eliminated by simply using hard switches in place of the PIN diodes. These schemes were tested at a frequency of 80 MHz, corresponding to $P^{31}$ in a 4.7 T magnet.

The circuit of FIG. 3a was found to be less favored for uncoupling tightly coupled surface coils presumably because the modification of the circuit is at the driving port and the introduction of a large reactive element only changes the resonant frequency by a few MHz. The degree of detuning is strongly influenced by the value of the matching capacitor 61 which depends on the loading of the coil and so, this method is regarded as less useful than the circuits of FIGS. 2, 3b and 3c.

The circuits of FIGS. 3b and 3c are found to complete isolate two concentric transmit surface coils. The circuit of FIG. 3c has obtained the most detailed studies because high impedance is introduced directly into the RF current path through the coil L. The use of balanced tuning, as for example in FIG. 3c, is employed with capacitances 62 and 60 approximately equal and capacitance 60 fixed so that trimming capacitance C need not depend on coil loading. From a large number of trial and error observations it has been found that the circuit of FIG. 3c in optimum configurations can yield equivalent results to that of FIG. 2. Most trial and error variations were made to minimize sensitivity losses in the coils and this was found to depend in a highly complex fashion on the values of inductances and capacitances used and their actual physical orientation with respect to each other, presumably because of generation of stray inductance and capacitance. In order to minimize losses, lengths of electrical leads must be kept as short as possible; thus the modifiable circuit element, e.g., $\lambda/4$ transmission lines of FIG. 2 including the PIN diodes are disposed close to the coils. There was evidence from changing the orientation of these second resonant circuits that they generated significant $B_1$ fields which interact with the adjacent tuned coils. It was found impossible to eliminate losses (up to 30%) resulting from these stray effects and in this aspect, it appears that the circuit of FIG. 2 has some advantage.

FIG. 4 shows the isocontour of the RF field obtained with concentric coils disposed on the surface of a homogeneous slice phantom. The sensitized volume of the uniformly distributed resonant nuclei, in such an arrangement, is then imaged and a measured signal strength is plotted as a function of depth (into the sample) and the radial coordinate on the surface along a diameter of the coils. The variation in signal strength is a measure of the spatial properties of the RF field inasmuch as the phantom is homogeneous. The image data was acquired with a spin echo sequence producing a signal intensity proportional to $\theta \sin^3 \theta$ where $\theta$ is the rotation angle due to the excitation pulse. These signal intensity contours are also isocontours of Rf field amplitude. Specific 90° and 270° isocontours are shown as examples.

Images 4(a)–4(c) were obtained using a $^1$H probe (200 MHz). In all instances the large coil is tuned and the small coil is detuned to (a)±48 MHz (ideal $\lambda/4$ length);

(b)+31, −70 MHz (1.5 cm longer than λ/4); (c)+31, −70 MHz (1.5 cm shorter than λ/4). The image of FIG. 4d was obtained for a P$^{31}$ probe (80 MHz) with the λ/4 cable length for the detuned small coil shortened by 8 cm. An identical image to FIG. 4a was obtained for a large coil when the small coil was removed from the probe. The cross-hatched areas indicate the most intense signal areas and the unshaded areas indicate little or no signal intensity. In relation to unit current in the large coil, calculated simulations of the vector sum of the RF fields of the two coils suggests that FIGS. 4b and 4d correspond to the induction of about +0.2 and −0.3 fractions, respectively, of the unit current in the small coil.

Figure 4A:
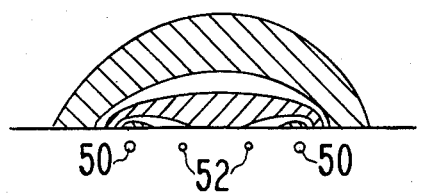
FIGS. 4a, 4b and 4c are experimental isocontours of RF field strength for a hydrogen phantom.
Figure 4B:
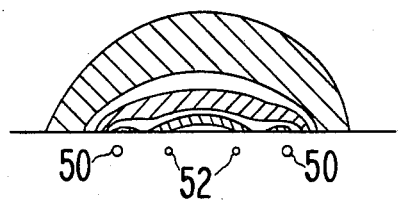
Figure 4C:
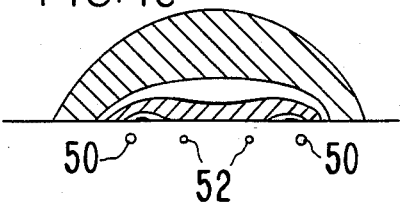
Figure 4D:
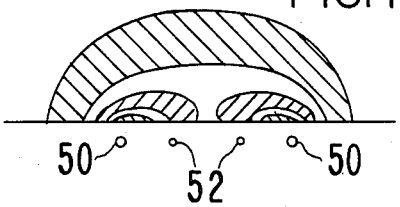
FIG. 4d is a similar isocontour for a phantom.

It is commonly believed that when one RF coil is placed near another, the RF field of the first induces current in the second coil so as to produce an RF field for the second coil in opposition to the first. This simple argument is not correct for the case of two coils, where one is detuned using one of the schemes indicated in FIGS. 2 and 3a–c, because where the detuned condition is offset, the RF field induced in the second coil may either add to, or subtract from the first RF field depending upon the sign of the offset. An experimental image of the RF field of a large surface coil in the presence of a completely detuned concentric small surface coil is shown in FIG. 4a and corresponds to the small coil being detuned to two frequencies equal distant from $F_0$ (200 MHz). If the λ/4 cable attached to the small coil is too long, the frequency split for the detuned small coil is offset to lower frequency and the induced RF field of the small coil adds to that of the large coil as is shown in FIG. 4b. In the alternative, if the λ/4 cable is too short, the frequency split is shifted to higher frequency and the induced RF field subtracts from the primary field as shown in FIGS. 4c and 4d. In terms of the offset of the frequency split, similar results were obtained using the circuit of FIG. 3c by appropriately adjusting the trimming capacitor C.

A number of benefits can be ascertained from these experimental observations. First, if the induced current in a detuned second coil can be either positive or negative with respect to the first coil, then it must always be possible to achieve zero current by appropriate adjustment, i.e., complete detuning must always be possible using the active detuning circuits of FIGS. 2 and 3a–c. Second, the degree of coupling between the two coils can be completely different depending upon whether the two coils are tuned/detuned or detuned/tuned. Thus, the detuning of the small coil may be offset using a cable length $L_1$ for a cable 68 (or 72) so that it couples negatively with the opposite coil 52 (or 50). In the reverse situation with the given coil tuned, e.g., cable length set at λ/4 and the opposite coil detuned, the cable length for the opposite coil may be set to achieve complete detuning and one obtains no coupling whatsoever.

Figure 5:
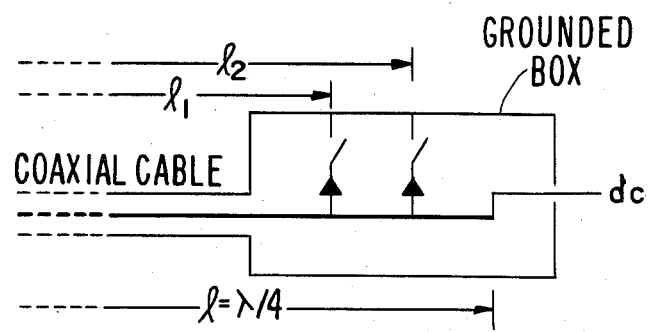
FIG. 5 describes means for selecting a desired λ/4 cable.

Third, for partial coupling, the overall RF field is the vector sum of the primary and induced fields. The overall geometric shape of this field can be calibrated experimentally (imaging as in FIGS. 4a–d) with respect to the length of the λ/4 cable and the observed detuned frequency split. Thus, for example, the shape of the RF field can be modified to improve signal localization for in vivo applications. In such situation, the normal RF field of a surface coil has RF isocontours which are concave with respect to the surface at any appreciable depth along the axis of the coil (see FIG. 4a) and this curvature is transferred to the shape of a localized volume produced by RF localization methods of prior art. However, if a negative induced field is produced by a second concentric coil as in FIGS. 4c and 4d, then this structure can be eliminated or even made convex. Accordingly, this ability to control the shape of RF fields provides a new means of controlling the shape of localized volumes produced by similar methods. Furthermore, by having the terminal portions of the λ/4 cables available in a grounded enclosure a number of lengths for a set of such cables $L_1, L_2 \ldots$ can be calibrated and any one of such cable lengths may be switched in using hard switches. Such an arrangement is shown in FIG. 5. Thus, various RF field shapes may be made available using simple hard switches. These possibilities are most readily achieved with the circuits of FIG. 2 and FIG. 5, although similar modifications can be employed with the other circuits to achieve the same purpose.

Although modifications and changes may be suggested by those skilled in the art, it is the intention of the inventor to embody within the patent all changes and modifications as reasonably and properly come within the scope of their contribution to the art.

What is claimed is:

1. Apparatus for controlling the shape and magnitude of the RF field applied to a body through active decoupling of a plurality of RF coils comprising, an RF source for providing RF energy having a power spectrum including a frequency component $\omega_0$;

a plurality of resonant circuits, first said resonant circuit comprising a first coil and a second said resonant circuit comprising a second coil, said first and second coils proximally disposed, each said resonant circuit capable of exhibiting resonant behavior at frequency $\omega_0$, said second resonant circuit comprising a plurality of frequency dependent reactive portions, at least one said reactive portion including means for receiving control information and capable of exhibiting very different frequency dependence in accord with said control information;

RF coupling means for applying said RF energy in common to each said resonant circuit, circuit means for supplying said control information to said second resonant circuit whereby the resonant behavior of said second resonant circuit is altered in a first sense of frequency offset with respect to $\omega_0$, to cause induction of RF current having a phase $\phi$ in said first coil due to said second coil and for altering the resonant behavior of said second resonant circuit in a second sense of frequency offset relative to $\omega_0$ to cause induction of an RF current having a phase $-\phi$ in said first coil, whereby the combined RF field due to both said coils is selectively controllable in magnitude and spatial distribution.

2. The apparatus of claim 1 wherein said first and second coils are concentrically disposed.

3. The apparatus of claim 1 wherein one of said plurality of reactive portions of said second circuit comprises a transmission line disposed between said second coil and ground, said circuit means comprising shorting means whereby said transmission line is shorted to select the input impedance of said transmission line.

4. The apparatus of claim 3 wherein circuit means comprises transmission line length selection means whereby said transmission line is shorted at a particular length for which said particular length, no substantial current is induced in said second coil and said transmission line length selection means is adapted to establish said short at greater and lesser lengths than said particular length.

* * * * *